United States Patent [19]

Tanaka

[11] Patent Number: 4,768,078
[45] Date of Patent: Aug. 30, 1988

[54] PLASTIC-MOLDED SEMICONDUCTOR DEVICE

[75] Inventor: Shigeru Tanaka, Fujisawa, Japan

[73] Assignee: Kabushiki Kaisha Toshiba, Kanagawa, Japan

[21] Appl. No.: 640,875

[22] Filed: Aug. 15, 1984

[30] Foreign Application Priority Data

Aug. 31, 1983 [JP] Japan ............................. 58-160124

[51] Int. Cl.⁴ .......................................... H01L 23/28
[52] U.S. Cl. ......................................... 357/72; 357/70; 357/80; 357/68
[58] Field of Search ................. 357/80, 70, 68, 65, 357/72

[56] References Cited

U.S. PATENT DOCUMENTS

| 3,864,820 | 2/1975 | Brenan et al. | 357/72 |
| 3,878,555 | 4/1975 | Freitag et al. | 357/68 |
| 4,142,203 | 2/1979 | Dietz | 357/80 |
| 4,301,464 | 11/1981 | Otsuki et al. | 357/72 |

FOREIGN PATENT DOCUMENTS

| 0025572 | 2/1977 | Japan | 357/72 |
| 55-53450 | 4/1980 | Japan | 357/72 |
| 58-14557 | 1/1983 | Japan | 357/72 |
| 0000162 | 2/1983 | Japan | 357/70 |
| 58-52863 | 3/1983 | Japan | 357/70 |
| 58-95844 | 6/1983 | Japan | 357/72 |
| 0194357 | 12/1983 | Japan | 357/68 |
| 2090055 | 6/1982 | United Kingdom | 357/70 |

OTHER PUBLICATIONS

Iwamura et al, "A 16-Bit Microprocessor on SOS--PULCE-", *Japanese Journal of Applied Physics*, vol. 18 (1979), Supplement 18-1, pp. 63-69.

Primary Examiner—Andrew J. James
Assistant Examiner—Mark Prenty
Attorney, Agent, or Firm—Foley & Lardner, Schwartz, Jeffery, Schwaab, Mack, Blumenthal & Evans

[57] ABSTRACT

A plastic-molded semiconductor device comprises a semiconductor pellet having an insulating substrate and an integrated circuit formed on the insulating substrate, and a pellet mounting member on which the semiconductor pellet is mounted. The pellet mounting member is not provided with any conductive portion at least under the center of the insulating substrate. The distance between the interconnection layer of the integrated circuit and the conductive portion of the pellet mounting member is relatively long, so the semiconductor device has a small parasitic capacitance. This results in a high speed and a low power dissipation.

1 Claim, 2 Drawing Sheets

PLASTIC-MOLDED SEMICONDUCTOR DEVICE

BACKGROUND OF THE INVENTION

The present invention relates to a plastic-molded semiconductor device, which comprises a semiconductor pellet having an insulating substrate such as a sapphire substrate and an integrated circuit formed on the insulating substrate, and a pellet mounting member on which the semiconductor pellet is mounted.

Recently the SOS (Silicon On Sapphire) technique and the SOI (Silicon On Insulator) technique have been developed, because they improve the performance of an integrated circuit. Using these techniques, a single crystal silicon is vapour-deposited on an insulating substrate, such as a sapphire substrate, and an integrated circuit is formed on the single crystal silicon. The integrated circuit has the characteristic that its interconnection layer has a smaller parasitic capacitance and a higher insulating resistance than an integrated circuit on a bulk substrate. This results in a high speed and a low power dissipation.

However, when the semiconductor pellet manufactured by the SOS or SOI technique is mounted on the conductor of the mounting bed of a lead frame, a considerable parasitic capacitance is produced, because the interconnection layer, the conductor of the mounting bed, the insulating substrate, and an $SiO_2$ layer constitute a capacitor. This capacitance makes it difficult for the integrated circuit to operate at a high speed.

SUMMARY OF THE INVENTION

It is an object of the present invention to provide a plastic-molded semiconductor device having a small parasitic capacitance and which is capable of operating at a high speed and with a low power dissipation.

This object is achieved by the plastic-molded semiconductor device, which comprises a semiconductor pellet having an insulating substrate and an integrated circuit formed on one surface of the insulating substrate. The device also comprises a pellet mounting member on which the semiconductor pellet is mounted, the pellet mounting member supporting the other surface of the insulating substrate. The pellet mounting member is not provided with any conductive portion under the central portion of the insulating substrate.

BRIEF DESCRIPTION OF THE DRAWINGS

In the accompanying drawings:

FIG. 4 is a partially sectional view of a plastic-molded semiconductor device according to the first embodiment of the present invention;

DETAILED DESCRIPTION OF THE INVENTION

Figure 1:
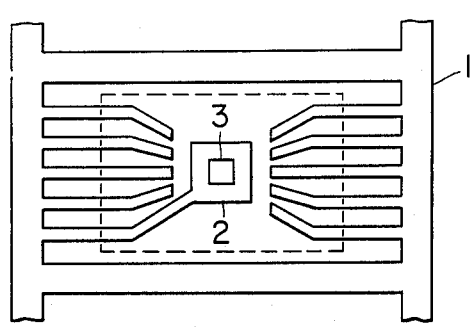
FIG. 1 is a plan view of a prior art semiconductor device.
Figure 2:
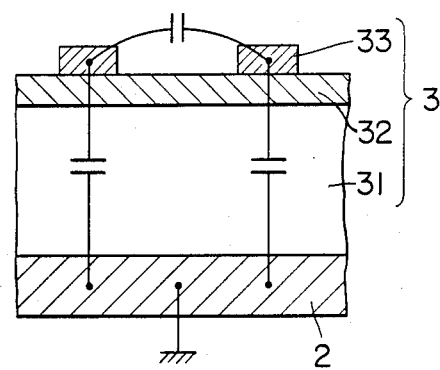
FIG. 2 is a partially sectional view of a prior art semiconductor device.

Prior to the description of the invention, a conventional plastic-molded semiconductor device will be briefly described with reference to FIGS. 1 and 2. The semiconductor device is formed in the following manner. A semiconductor pellet 3 on which an integrated circuit is formed on the mounting bed 2 of a lead frame 1, as shown in FIG. 1. The semiconductor pellet 3 is bonded to inner leads of the lead frame 1 with wire, and is plastic-molded. Since the mounting bed 2 of the lead frame 1 is made of a metal, a considerable parasitic capacitance is still present in the semiconductor device. Specifically, as shown in FIG. 2, the semiconductor pellet 3 comprising an insulating substrate 31, an $SiO_2$ layer 32 and an interconnection layer 33 is mounted on the bed 2, in other words, the insulating substrate 31 and the $SiO_2$ layer are put between the interconnection layer 33 and the mounting bed 2, so that they constitute a capacitor. As a result, a considerable parasitic capacitance is produced.

Figure 3:
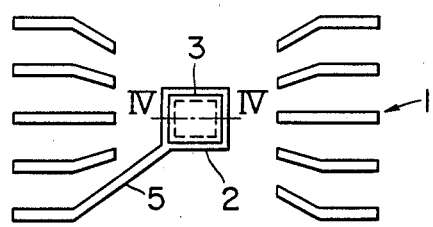
FIGS. 3 and 4 are a plan view and a partially showing a plastic-molded semiconductor device according to a first embodiment of the present invention.
Figure 4:
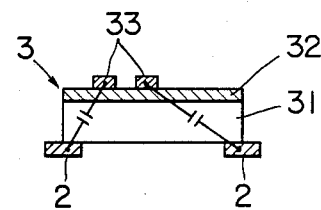

FIGS. 3 and 4 show the plastic-molded semiconductor device according to a first embodiment of the present invention. The mounting bed 2 of the lead frame 1 of this embodiment is connected to an extended end of an inner lead of the lead 5 frame. The mounting bed 2 is in the form of a hollow rectangular member, or a rectangular ring, slightly larger than the semiconductor pellet 3. The periphery of the semiconductor pellet 3 is supported on the mounting bed 2. The semiconductor pellet 3 mounted on the bed 2 undergoes a wire bonding operation and is plastic-molded. According to this embodiment, as shown in FIG. 4, there is no metalic portion under the center portion of the semiconductor pellet 3, so that the distance between the conductor of the bed 2 and the interconnection layer 33 is longer than the conventional semiconductor device. As a result, the parasitic capacitance is reduced.

Figure 5:
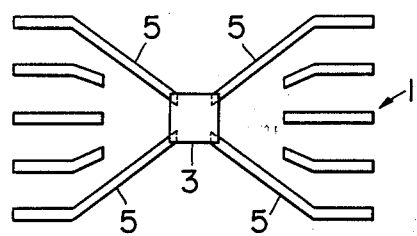
FIG. 5 is a plan view showing a plastic-molded semiconductor device according to a second embodiment of the present invention.

FIG. 5 shows the plastic-molded semiconductor device according to a second embodiment of the present invention. This semiconductor device does not have a bed for mounting the semiconductor pellet 3. Instead of having a bed, four inner leads 5 of the lead frame 1 are extended toward the center of the lead frame 1, and the four extended ends of the inner leads 5 support the semiconductor pellet 3. Since there is a relatively long distance between the conductor of the inner leads 5 and the interconnection layer 33, with this embodiment as well, it is possible to reduce the parasitic capacitance. There is no restriction on the number of the extended inner leads 5 supporting the semiconductor pellet 3.

Figure 6:
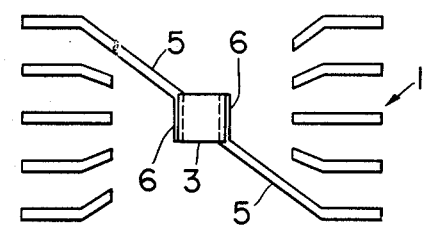
FIG. 6 is a plan view showing a plastic-molded semiconductor device according to a third embodiment of the present invention.

FIG. 6 shows the plastic-molded semiconductor device according to a third embodiment of the present invention. Two inner leads 5 of the lead frame 1 of this semiconductor device are extended toward the center of the lead frame 1, and the extended portions 6 of the two inner leads 5 are bent so as to be parallel to each other. The extended portions 6 of the inner leads 5 support the periphery of the semiconductor pellet 3. This embodiment makes it possible to support the semiconductor pellet 3 more firmly.

In the above-mentioned first to third embodiments, the periphery of the semiconductor pellet 3 is supported by metal, or another conductive material. In this manner, there is no metallic portion under the center portion of the semiconductor pellet 3. Thus, it is possible to reduce the parasitic capacitance.

Figure 7:
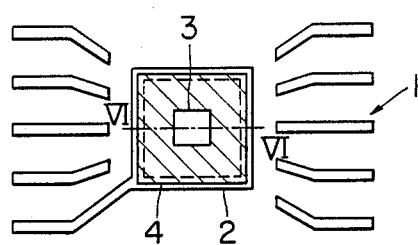
FIG. 7 is a plan view showing a plastic-molded semiconductor device according to a fourth embodiment of the present invention.
Figure 8:
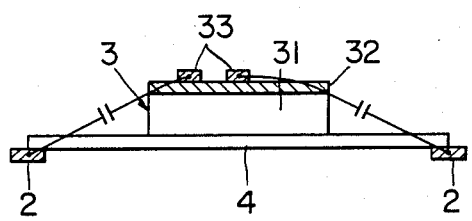
FIG. 8 is a partially sectional view showing a plastic-molded semiconductor device according to the fourth embodiment of the present invention.

FIGS. 7 and 8 show the plastic-molded semiconductor device according to a fourth embodiment of the present invention. Where semiconductor devices are mass-produced, it is not costly to size the mounting bed of the rectangular ring to conform to a specific semiconductor pellet as in the first embodiment. However, where many kinds of semiconductor devices are produced on a small scale, it is economical to use a lead frame which is common to all kinds of semiconductor devices as in this embodiment. As shown in FIG. 7, the mounting bed 2 of the common lead frame 1 of this embodiment is in the form of a relatively large hollow rectangular member, or a rectangular ring. An insulating plate, such as a glass plate, a glass epoxy laminate or a plastic plate, substantially the same size as the rectangular ring, is affixed to the rectangular ring. The semiconductor pellet 3 is supported on the insulating plate 4. The mounting bed 2 of this embodiment is capable of supporting semiconductor devices of many different sizes. As shown in FIG. 8, the distance between the conductor of bed 2 and interconnecting layer 33 is longer than that the first to third embodiments, so that this embodiment makes it possible to further reduce the parasitic capacitance.

Figure 9:
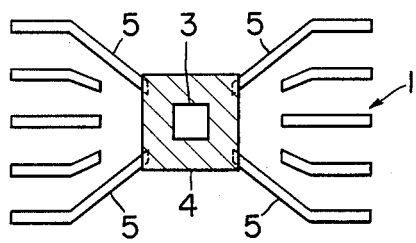
FIG. 9 is a plan view showing a plastic-molded semiconductor device according to an fifth embodiment of the present invention.

FIG. 9 shows the plastic-molded semiconductor device according to a fifth embodiment of the present invention. In this embodiment, four inner leads 5 of the lead frame 1 are extended toward the center of the lead frame 1, and four extended ends of the inner leads 5 and an insulating plate, such as a glass plate, a glass epoxy laminate or a plastic plate are affixed to the four extended ends. The semiconductor pellet 3 is supported on the insulating plate 4. This embodiment makes it possible to support many different sizes of the semiconductor devices, and reduce the parasitic capacitance. There is no restriction on the number of the extended inner leads supporting the insulating plate 4.

Figure 10:
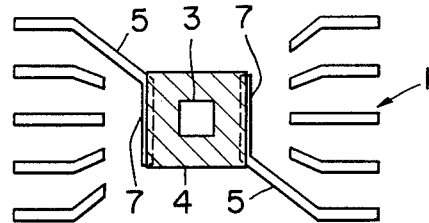
FIG. 10 is a plan view showing a plastic-molded semiconductor device according to a sixth embodiment of the present invention.

FIG. 10 shows the plastic-molded semiconductor device according to a sixth embodiment of the present invention. Two inner leads 5 of this semiconductor device are extended toward the center of the lead frame 1, and the extended portions 7 of two inner leads 5 are bent so that they are parallel to each other. An insulating plate 4, such as a glass plate, a glass epoxy laminate or a plastic plate, is stuck on the extended portions of the inner leads 5. The semiconductor pellet 3 is supported on the insulating plate. This embodiment makes it possible to support the semiconductor device 3 more firmly.

In the above-mentioned fourth through sixth embodiments, the periphery of the insulating plate 4 is supported by metal, another conductive material, and the semiconductor pellet 3 is supported on the center of the insulating plate. The distance between the conductor of the bed 2 and interconnection layer 33 is longer. Thus, it is possible to further reduce the parasitic capacitance.

The present invention may be practiced or embodied in other ways without departing from the spirit or essential character thereof. For instance, while in the illustrated preferred embodiments, the mounting bed supporting the semiconductor device or the insulating plate is in the form of a rectangle, the mounting bed may alternately be in other forms, such as a square, a parallelogram, or a trapezium. That is to say, there is no restriction as to the form of the pellet mounting member so long as it is not provided with any conductive portion at least under the center portion of the semiconductor pellet. Also, the mounting bed may be supported by tie-bars instead of the extended inner leads.

In the embodiments described above, the interconnection layer is formed on an $SiO_2$ layer, but the present invention is also applicable to a situation where the interconnection layer is formed on a single crystal silicon in an element area.

Additionally the semiconductor pellet manufactured by the SOS or SOI technique can be replaced by a semiconductor pellet having any other insulating substrate, such as a GaAs IC having a GaAs substrate.

As stated above, the present invention makes it possible to reduce a parasitic capacitance. This results in a high speed operation with low power dissipation. The present invention is particularly useful, because a plastic-molded semiconductor device is generally cheaper than a semiconductor device with a ceramic package.

What is claimed is:

1. A plastic-molded semiconductor device comprising:

a semiconductor pellet having an insulating substrate, an integrated circuit formed on a first surface of said insulating substrate, a pellet mounting member on which said semiconductor pellet is mounted, said pellet mounting member having an insulating plate supporting a second surface of said insulating substrate of said semiconductor pellet, said insulating plate having a periphery along an outer edge of said insulating plate; and a conductive support means for supporting said insulating plate in a manner which produces a reduced parasitic capacitance by contacting said insulating plate only along said periphery of said insulating plate; and an inner lead, wherein said conductive support means is in the shape of a substantially rectangular ring and said conductive support means is connected to said inner lead.

* * * * *